(12) United States Patent
Kelley et al.

(10) Patent No.: US 6,191,980 B1
(45) Date of Patent: Feb. 20, 2001

(54) SINGLE-POLY NON-VOLATILE MEMORY CELL HAVING LOW-CAPACITANCE ERASE GATE

(75) Inventors: Patrick J. Kelley, Orlando, FL (US); Ross A. Kohler, Allentown, PA (US); Chung W. Leung, Orlando, FL (US); Richard J. McPartland, Nazareth, PA (US); Ranbir Singh, Orlando, FL (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/583,505

(22) Filed: May 31, 2000

Related U.S. Application Data

(60) Provisional application No. 60/187,550, filed on Mar. 7, 2000.

(51) Int. Cl.$^7$ .................................................. G11C 16/04
(52) U.S. Cl. .............................. 365/185.29; 365/185.01; 365/185.05
(58) Field of Search .................... 365/185.29, 185.01, 365/185.05, 185.1, 185.14

(56) References Cited

U.S. PATENT DOCUMENTS

| | | | |
|---|---|---|---|
| 5,615,150 | * 3/1997 | Lin et al. | 365/185.17 |
| 5,978,274 | * 11/1999 | Wang | 365/185.29 |
| 6,038,171 | * 3/2000 | McElheney | 365/185.29 |
| 6,101,131 | * 8/2000 | Chang | 365/185.29 |
| 6,125,059 | * 9/2000 | Hecht | 365/185.29 |

OTHER PUBLICATIONS

"A Single Poly EEPROM Cell Structure for Use in Standard CMOS Processes," by Katsuhiko Ohsaki et al., IEEE Journal of Solid–State Circuits, vol. 29, No. 3, Mar. 1994, pp. 311–316.

* cited by examiner

*Primary Examiner*—Son T. Dinh

(57) ABSTRACT

A single-poly flash memory cell has a control device, a switch device, and an erase device, all of which share a common polysilicon floating gate which is designed to retain charge in the programmed memory cell. The memory cell is erased by applying an erase voltage to the tub of the erase device to cause tunneling across the oxide layer separating the floating gate from the rest of the erase device structure. Since a typical tub-to-source/drain breakdown voltage (e.g., 15 volts) is greater than a typical erase voltage (e.g., 10 volts), the memory cell can be safely erased without risking the junction breakdowns that are associated with other prior art single-poly memory cell designs for deep sub-micron technologies (e.g., 0.25-micron and lower).

22 Claims, 5 Drawing Sheets

SINGLE-POLY NON-VOLATILE MEMORY CELL HAVING LOW-CAPACITANCE ERASE GATE

CROSS-REFERENCE TO RELATED APPLICATIONS

This application claims the benefit of the filing date of U.S. provisional application no. 60/187,550, filed on 03/07/00 as attorney docket no. Kelley 9-7-31-22-25.

BACKGROUND OF THE INVENTION

1. Field of the Invention

The present invention relates to integrated circuits, and, in particular, to non-volatile memory cells.

2. Description of the Related Art

A single-poly EEPROM (electronically erasable programmable read-only memory) cell structure implemented in a standard CMOS process is described by K. Ohsaki, N. Asamoto, and S. Takagaki in "A Single Poly EEPROM Cell Structure for Use in Standard CMOS Processes," IEEE Journal of Solid-State Circuits, Vol. 29, No. 3, March 1994, pp. 311–316 ("the Ohsaki paper"), the teachings of which are incorporated herein by reference.

FIGS. 1A and 1B show a schematic and a topologic view, respectively, of the single-poly EEPROM cell 100 described in the Ohsaki paper (also referred to as the IBM cell). Single-poly EEPROM cell 100 comprises a PMOS transistor MC1 102 and an adjacent NMOS transistor M2 104 that share an electrically isolated common polysilicon gate 106. The common gate 106 works as a floating gate with the inversion layer of the PMOS transistor and p+ diffusions working as a control gate 108.

The Ohsaki paper describes single poly EEPROM cells in the context of a 0.8-micron standard logic CMOS process. The Ohsaki paper describes two different techniques for erasing the single poly EEPROM cell: one relies on FN (Fowler Nordheim) tunneling between the floating gate 106 and the p+diffusion in the PMOS transistor 102 and the other relies on FN tunneling between the floating gate 106 and the n+ diffusion in the NMOS transistor 104. In either case, a voltage of sufficient magnitude must be applied across the oxide separating the polysilicon gate from the underlying structure in order to achieve the desired FN tunneling.

Conventional non-volatile memory cells require at least about 90–100A of oxide to separate the polysilicon gate from the underlying structure to maintain data in the cells for a reasonable time (about 10 years). To erase a cell through FN tunneling, the electric field across this tunnel oxide must be at least about 10MV/cm. Thus, to achieve FN tunneling across a 90–100A tunnel oxide, a voltage of at least about 9–10V would need to be applied across the oxide to perform an erase operation.

According to the Ohsaki paper, the erase voltage is applied to the source/drain of the devices. As such, the 9–10V erase voltage would need to be applied to the device junctions. However, in advanced deep sub-micron technologies, the junction breakdown of devices is rapidly decreasing. For example, in some 0.25-micron technologies, junction breakdown voltages are as low as 7V. Moreover, this junction breakdown voltage level will likely continue to decrease as devices are scaled down even more. As such, the single poly EEPROM cell structure described in the Ohsaki paper cannot be effectively implemented for deep sub-micron technologies of at least 0.25 $\mu$m and smaller, because the voltages required to perform an erase operation would likely result in device-threatening junction breakdowns.

SUMMARY OF THE INVENTION

The present invention is directed to a single poly EEPROM (i.e., flash) cell structure that is suitable for deep sub-micron technologies. In certain embodiments of the present invention, a Fowler-Nordheim (FN) erase gate device is added to the single poly cell structure described in the Ohsaki paper, where the erase gate device shares the same common floating gate as the PMOS and NMOS devices, but where the gate capacitance of the erase gate device is much smaller than the total gate capacitance of the floating gate. Typically, the floating gate-to-erase-N-tub capacitance is designed such that the ratio of the floating gate-to-erase-N-tub capacitance is less than about 0.25 times the total floating gate capacitance. According to these embodiments, the cell is erased by applying an erase voltage (e.g., about 9–10V) to the n tub (and thus the source S and drain D) of the erase gate device to provide the necessary voltage across the tunnel oxide to achieve FN tunneling. Since this voltage is less than a typical tub breakdown voltage (i.e., about 13–15V), the single poly flash cell of the present invention can be erased without risking the occurrence of device-damaging breakdowns. In addition, for particular embodiments of the present invention, changes are made to the control gate design (as compared to the cell structure described in the Ohsaki paper) to effectively lower the cell threshold voltage.

The resulting cell can be fabricated with only one additional masking step above a core CMOS logic process, thick-gate oxide. The benefits include: (1) low VDD read operation by lower erased-state cell threshold, (2) higher endurance, (3) longer data retention, (4) lower gate voltage for programming, and (5) if using negative gate voltage during erase, less negative gate voltage for erasure.

In one embodiment, the present invention is a single-poly memory cell, comprising (a) a control device; (b) a switch device; and (c) an erase device comprising an erase gate. The control, switch, and erase devices share a common, polysilicon floating gate configured to retain charge as a result of programming the memory cell. The memory cell is configured to be erased by causing tunneling between the erase gate and the floating gate without causing any junction breakdown within the memory cell.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1A:
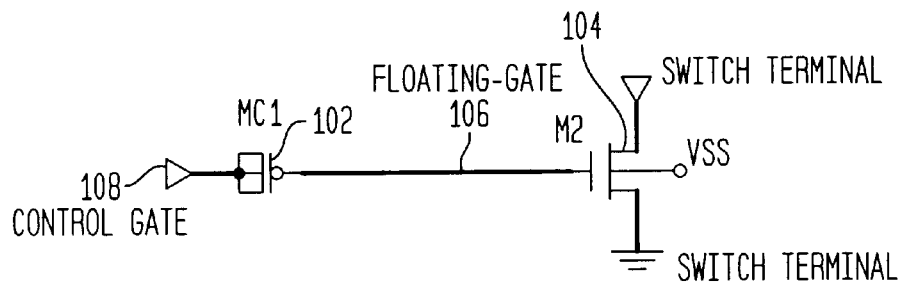
FIGS. 1A and 1B show a schematic and a topologic view, respectively, of a prior art single-poly EEPROM cell.
Figure 1B:
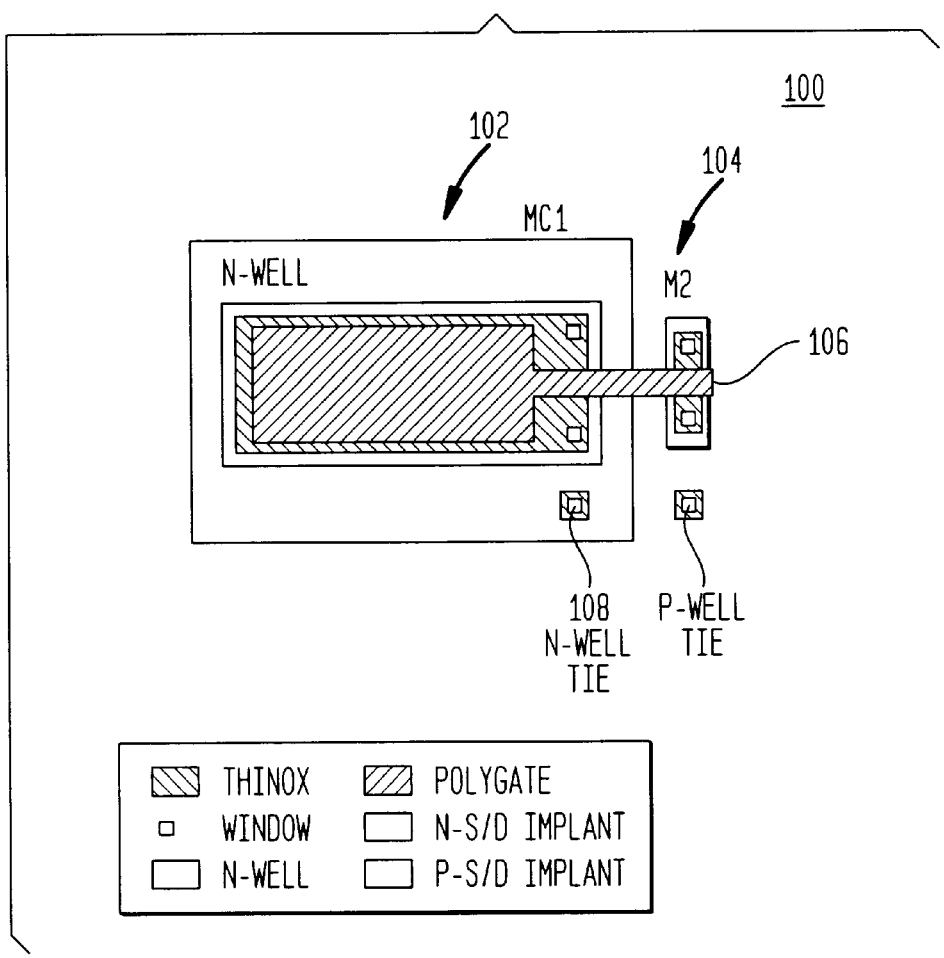
Figure 2A:
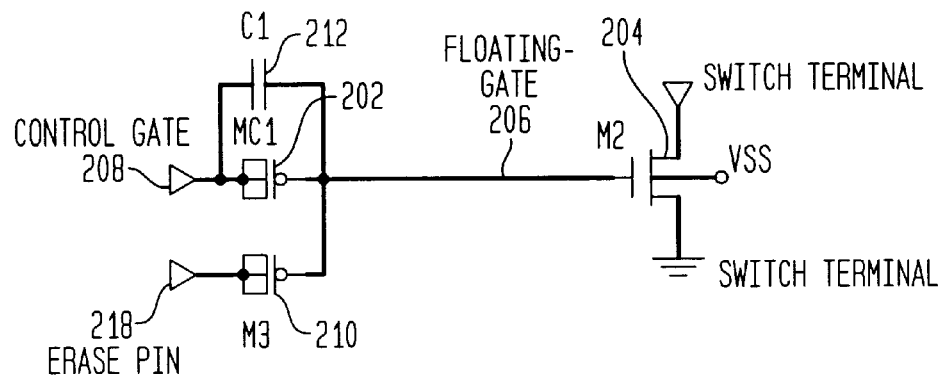
FIGS. 2A and 2B show the schematic and topologic view, respectively, for a single poly flash cell, according to one embodiment of the present invention.
Figure 2B:
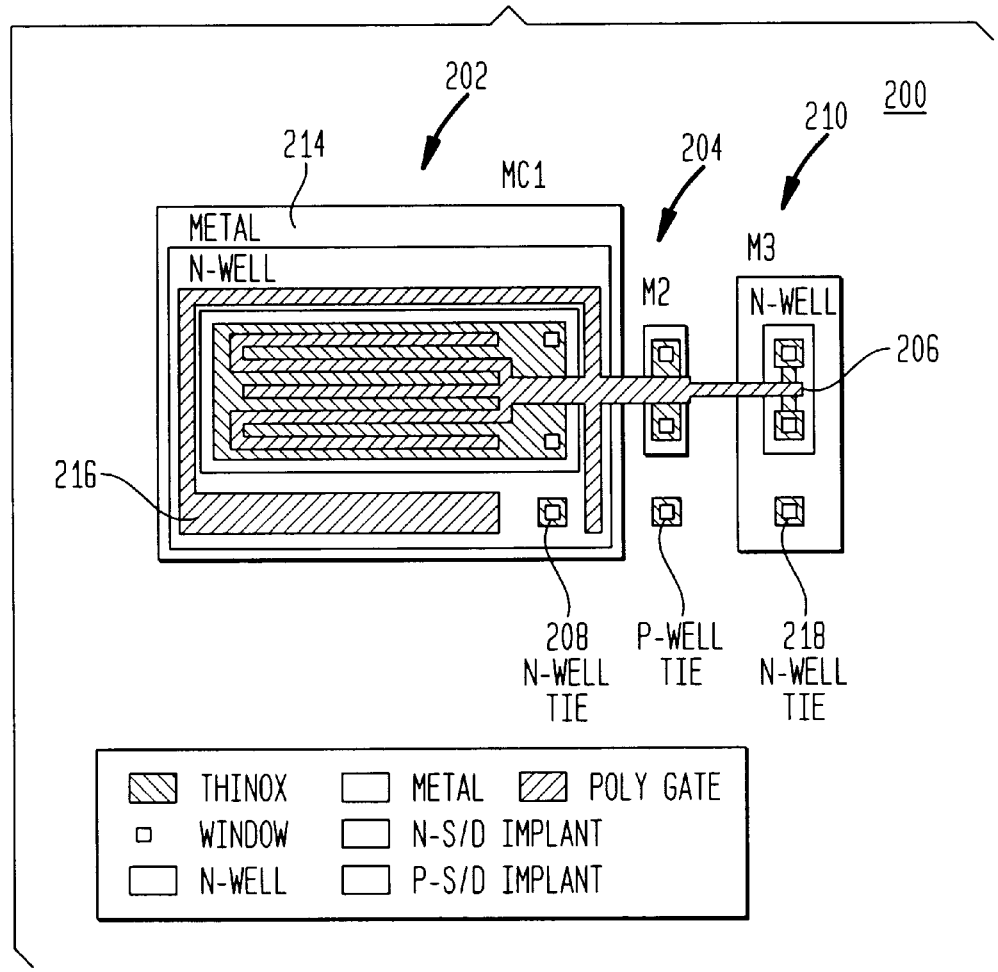

FIGS. 2A and 2B show the schematic and topologic view, respectively, for a single poly EEPROM or flash cell 200, according to one embodiment of the present invention. Flash cell 200 comprises a PMOS transistor MC1 202, an NMOS transistor M2 204, and an erase device M3 210, all of which share a common, polysilicon floating gate 206. Respectively, PMOS transistor 202 and NMOS transistor 204 are analogous to the control device and the switch device formed by PMOS device 102 and NMOS device 104 in the single poly EEPROM cell 100 of FIGS. 1A–B. Although flash cell 200 is implemented on a P-type substrate, those skilled in the art will understand that the present invention can also be implemented on an N-type substrate.

Flash cell 200 also comprises metal and poly capacitors C1 212, formed from a metal layer 214 electrically connected to the control gate 208, polysilicon regions 216 extending from the floating gate 206, as well as the "meandering" configuration of the portion of floating gate 206 corresponding to PMOS device 202, as shown in FIG. 2B. Typically, the floating gate-to-read-N-tub capacitance should be more than about 0.6 times the total gate capacitance.

Table I lists the approximate operational biases for flash cell 200, and Table II lists the approximate design parameters for flash cell 200. Flash cell 200 is written to by hot electron injection and erased by FN tunneling.

TABLE I

CELL VOLTAGES

|  | Source | Drain | Control Gate | Erase Gate |
|---|---|---|---|---|
| Erase | 0 | 0 | 0 | 10 |
| Program | 0 | 5.5 | 6.5 | 0 |
| Read | 0 | 1.5 | 2.25–2.75 | 0 |

TABLE II

DEVICE SUMMARY

| | |
|---|---|
| Technology | 0.25-micron, 2.5-volt, logic, CMOS |
| Normal Device Gate Oxide | 50A |
| Cell & High Voltage Gate Oxide | 100A |
| Cell Size | 50 square microns |
| Cell Current (erased) | >1E-5 amps |
| Cell Current (programmed) | <1E-12 amps |
| Endurance | 1000 cycles |
| Data Retention | >10 years |

Fowler-Nordheim Tunneling Erase-Gate

Because of the limitations imposed by junction breakdown voltages for many of today's low voltage logic CMOS technologies, the single-poly flash cell described in the Ohsaki paper must use band-to-band tunneling to inject charge onto the floating gate for erasure. Referring again to FIGS. 1A–B, to erase EEPROM cell 100, the control gate 108 is biased at ground, while the drain of NMOS device M2 104 is biased with a high positive voltage. In a 0.25-micron technology, the N+ drain to P substrate breakdown voltage limits the erase drain-to-substrate bias to about 7.0 volts. With 100A gate oxide, the resulting oxide field is not high enough for FN tunneling, but does induce band-to-band tunneling, injecting holes through the oxide and onto the floating-gate. After erasure, the cell threshold voltage, as measured at the control-gate is about four volts. During read operation, the control-gate voltage must be above this level to interrogate the cell.

According to embodiments of the present invention, in order to lower the cell threshold, P-transistor erase gate M3 210 of FIGS. 2A–B is added. Because the erase gate 218 is the combination of the device's P+ source, P+ drain, and N tub, it can be raised above the source/drain-to-tub junction breakdown voltage to just below the much higher tub-to-substrate breakdown voltage. With the control gate 208 biased at ground, the resulting erase device gate-oxide field is sufficient for FN tunneling of electrons from the floating gate 206 to erase gate 218. As discussed below in the section entitled "Experimental Results," the cell threshold can be erased to less than one volt allowing read operations with control-gate voltage at VDD levels.

Control Gate Design

Figure 4:
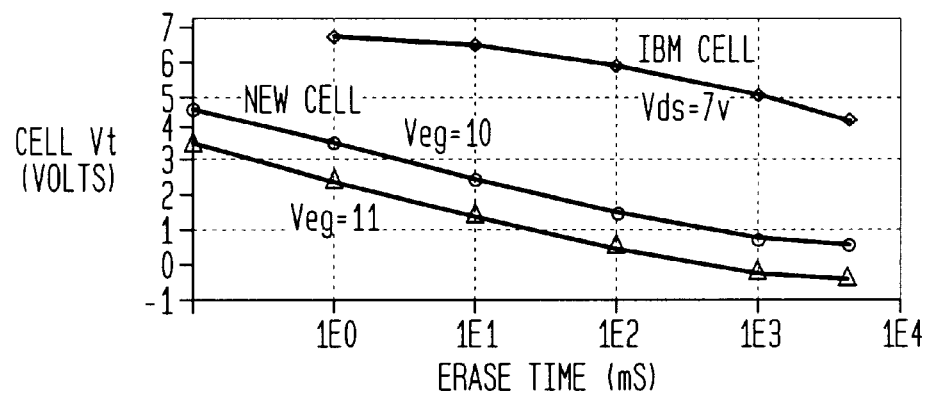
FIG. 4 shows the threshold voltages for the prior art EEPROM cell of FIGS. 1A–B and the flash cell of FIGS. 2A–B as a function of erase time.

In EEPROM cell 100 of FIGS. 1A–B, the control gate device (102) has the customary rectangular poly structure. Strong coupling of the control-gate node 108 (source-drain-tub of MC1) to the floating gate 106 occurs at threshold with the formation of the inversion region within MC1. Thus, the control-gate potential necessary for cell conduction is greater than the combined threshold of the control-gate device MC1 and the switch device M2. As shown in FIG. 4 of the subsequent "Experimental Results" section, the threshold of an erased cell 100 was below 1 volt for erase times on the order of about 1 second.

In order to lower the effective control-gate device threshold, flash cell 200 has three additional capacitors that couple the control gate 208 to the floating gate 206. The most significant is the source/drain overlap and fringing capacitance, added by using the long, narrow, meandering poly-gate structure of MC1 shown in FIG. 2B. To further increase the control-gate-to-floating-gate coupling, additional poly (216) was placed over the device's N-tub, and a metal plate 214, connected to the control gate 208, was placed over the poly floating-gate structure. The effective lowering of cell threshold was 0.7 volts.

Circuit Configuration

Figure 3:
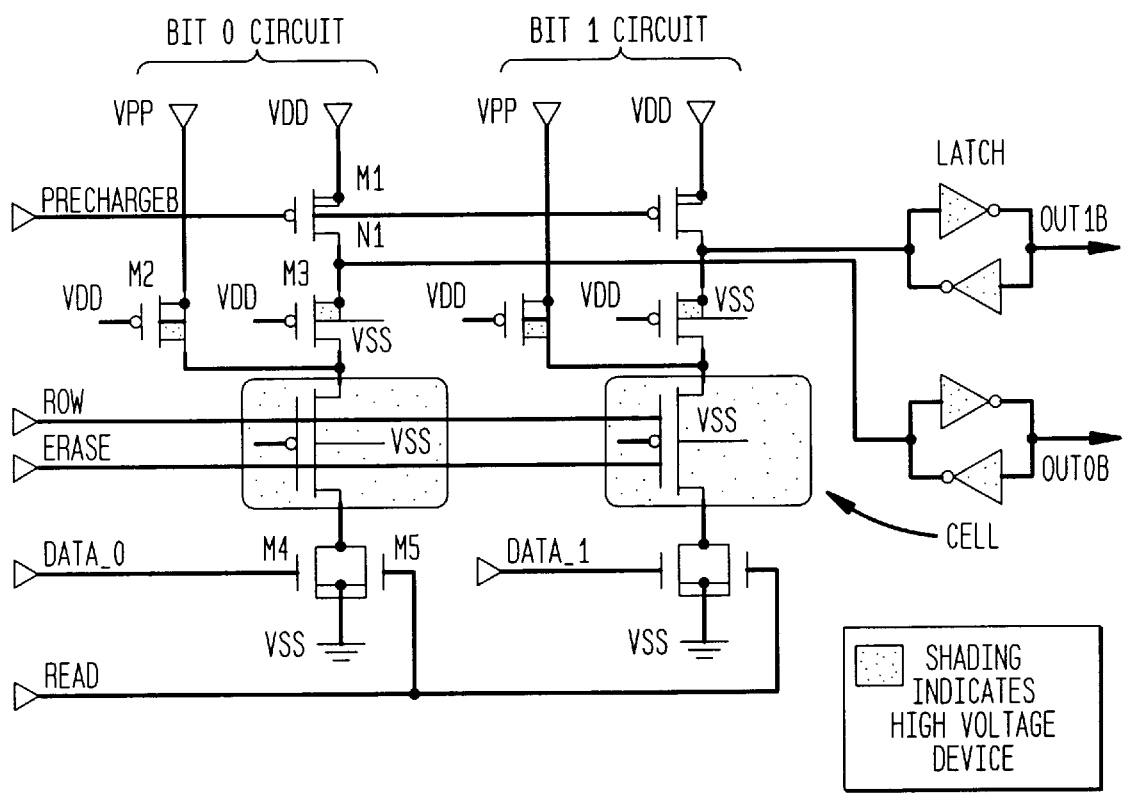
FIG. 3 shows a circuit showing an application of the flash cell of FIGS. 2A-B as flash memory to control redundancy in large SRAM blocks.

FIG. 3 shows a circuit showing an application of flash cell 200 as flash memory to control redundancy in large SRAM blocks. The architecture relies on a row of flash cells, not an array. Each flash cell is incorporated into the circuit capable of erasing, programming, reading, and latching data. For illustrative purposes, a row only two bits long is shown in FIG. 3. Each bit uses two transistors capable of supporting high voltages (VPP). These transistors have thicker gate oxides and longer channel lengths. One P-channel device (M2) routes VPP onto the cell drain for programming. The other high voltage device (M3) isolates the precharge device (M1) and latch inverters from VPP during programming.

Erase takes place by FN electron tunneling from the floating gate to the erase gate's source/drain and tub-inversion regions. Tunneling is accomplished by raising the ERASE line to high voltage while the ROW line is at ground, and the PRECHARGEB, DATA_X, and VPP lines are at VDD.

The ERASE line is a node common to all erase gates. It is preferably connected directly to an off-chip power supply, so that there is no on-chip switching of high erase voltage.

Programming takes place by hot-electron injection from the channel region of the switch device to its floating gate. Programming is done by raising ROW and VPP to high voltage levels, while keeping ERASE and READ at ground, and keeping PRECHARGEB and DATA_X at VDD. For those cells, along the row that are not to be programmed, DATA_X is set at ground opening the current path through the cell so that hot electron injection cannot occur.

Read operations take place by interrogation of cell conductivity. If the cell is erased, its low threshold makes it conductive when ROW is raised to VDD. If the cell has been programmed, its high threshold will inhibit conductance even though ROW is raised to VDD. To read the cell, node N1 is first precharged by PRECHARGEB being lowered to ground for a short period of time. The cell is read after precharge (PRECHARGEB has been raised to VDD). ROW and READ are raised to VDD while ERASE remains at ground and VPP remains at VDD. This sets up the conduction path from node N1 to ground through the cell. If the cell is erased (conductive), node N1 will be lowered to ground and OUTXB will be latched high. If programmed, the cell will break the conduction path, node N1 will remain high, and OUTXB will remain low.

Experimental Results

Three types of testers have been characterized: single cell testers for prior art EEPROM (IBM) cell 100 of FIGS. 1A–B, single cell testers for flash cell 200 of FIGS. 2A–B, and 4K-bit array testers for flash cell 200. The array tester consists of 32 rows. Each row is similar to the row illustrated in FIG. 3, except that they are 128 bits long. All bits in all rows are read at the same time and results are latched in a 4K-bit shift register for serial access. Each row is programmed separately, but all 128 bits within the row can be programmed at the same time. Programmed test data was all 1's, all 0's, or alternating data. All cells were erased at the same time.

Single Cell Data

FIG. 4 shows the threshold voltage for prior art IBM cell 100 as a function of erase time for a drain voltage of 7.0 volts. The drain-to-tub breakdown voltage of 7.1 volts limited the drain voltage. It is desired to have an erased cell threshold below 1.5 volts. This is determined by a minimum read control-gate voltage of 2.25 volts (i.e., minimum VDD) minus 0.5 volts of threshold margin and minus 0.25 volts of gate drive over threshold when reading. With a drain voltage of 7.0 volts and erase duration of one second, the threshold is reduced to only 4 volts; after ten seconds of erase, it is reduced to 3 volts.

FIG. 4 also shows the threshold voltage for flash cell 200 as a function of erase time. After a one-second erase with the erase gate at 10 volts, the cell has been erased to a threshold of 1 volt, below the critical threshold value of 1.5 volts. With 11 volts on the erase gate, the cell threshold can be erased to below 0 volts.

Figure 5:
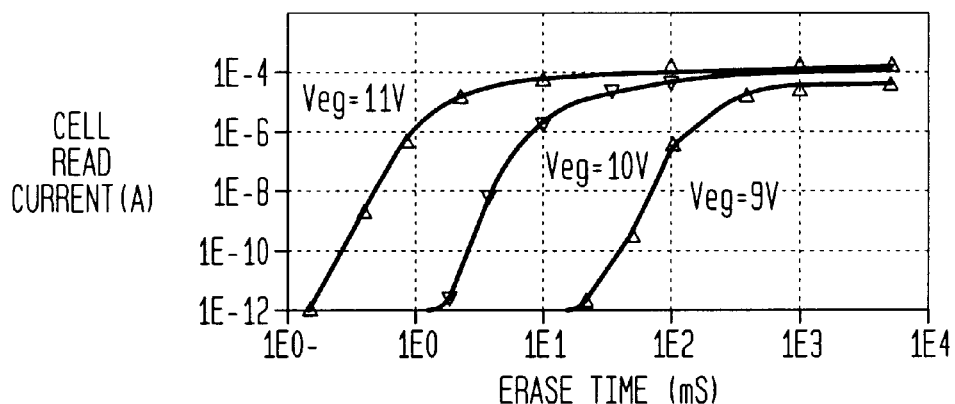
FIG. 5 illustrates read current as a function of erase time for the flash cell of FIGS. 2A–B.

FIG. 5 illustrates read current as a function of erase time for flash cell 200. After 1 second of erasure, read current is above 10 $\mu$A even after erasing with erase-gate voltage as low as 9 volts.

Figure 6:
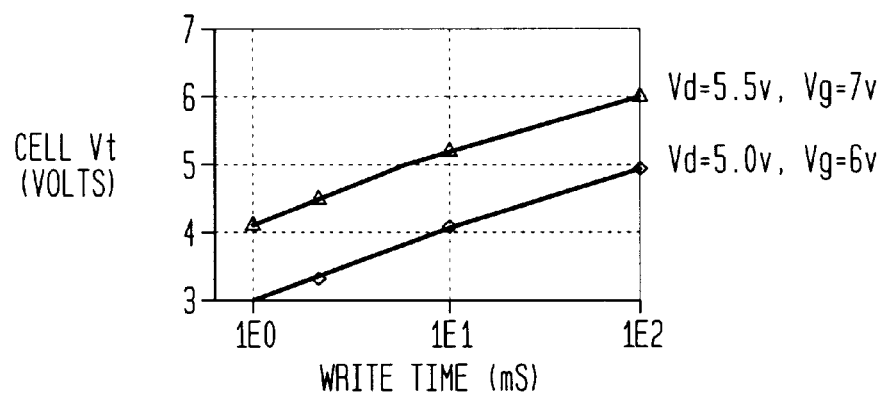
FIG. 6 shows the threshold voltage for the flash cell of FIGS. 2A–B as a function of program time.

FIG. 6 shows the threshold voltage for flash cell 200 as a function of program time. The programmed threshold is desired to be above 4 volts. This is determined by the maximum read control-gate voltage of 2.75 volts (i.e., maximum VDD) plus 1.25 volts of threshold margin. After 10-mS programming, the threshold voltage is above 4 volts for a drain-to-source bias of at least 5 volts and a gate-to-source bias of at least 6 volts.

Figure 7:
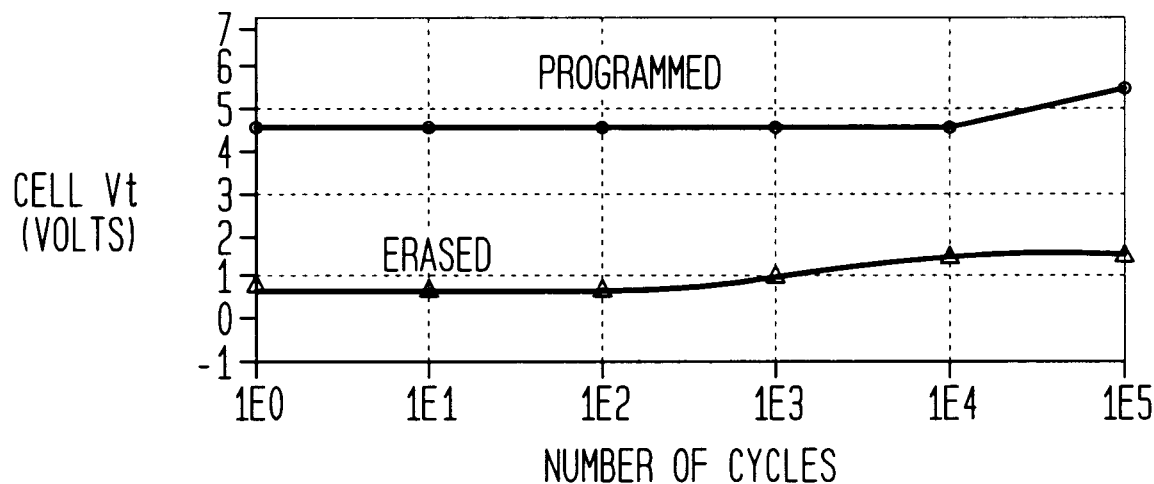
FIG. 7 shows threshold shifts after cycling for the flash cell of FIGS. 2A–B.

FIG. 7 shows threshold shifts after cycling for flash cell 200. From 1,000 to 10,000 cycles, there is an increase of 0.6 volts in erased threshold. After 1,000 cycles, there is also a corresponding roll-off of read current.

Figure 8:
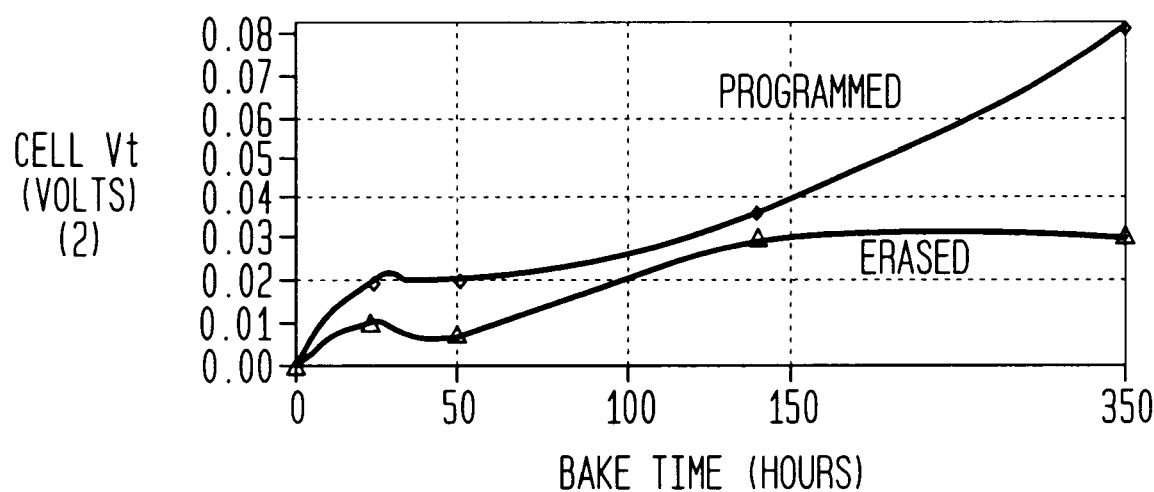
FIG. 8 shows the post-cycling threshold shift (after 50 cycles) for the flash cell of FIGS. 2A–B as a function of time in a 250C data-retention bake.

FIG. 8 shows the post-cycling threshold shift (after 50 cycles) for flash cell 200 as a function of time in a 250C data-retention bake. After 25 hours, the erased cell threshold has increased less than 20 mV. It then levels off with less than a 40-mV shift. Programmed threshold initially decreases by 20 mV after 25 hours. It then decreases more slowly at a rate of 0.2 mV per hour 4K-bit Cell Array Data The voltages used for erasing and programming the 4K-bit array are shown in Table 1. Erase duration was 1 second; program duration was 10 mS. VDD was 2.25 to 2.75 volts. Erased cells were read with VDD=2.25 volts (VDD min). Control-gate voltage for reading erased cells was 1.75 volts, therefore ensuring 0.5 volts of threshold voltage margin. Programmed cells were read with VDD=2.75 volts (VDD max). Control-gate voltage for reading programmed cells was 3.95 volts, ensuring 1.2 volts of threshold voltage margin for programmed cells. Endurance was tested on the arrays. They were tested for 1,000 cycles and did not have any failures.

To demonstrate lower voltage operation, arrays were erased using 10.7 volts on the erase gate for 1 second. The arrays were successfully read with VDD=1.25 volts and a row voltage of 0.75 volts.

Discussion and Conclusion

A new low-cost, single-poly, embedded flash memory cell has been developed. It is totally compatible with low voltage (1.25<=VDD) CMOS technologies that have low source/drain-to-tub junction breakdown voltages. Only a single mask adder is required; it is used for fabrication of thick-gate oxide. This cell is well suited for one-time-programmable (OTP) and few-time-programmable (FTP) applications, such as programming the replacement of faulty SRAM or DRAM memory elements.

In single cell testers and cell arrays, cells have been erased to less than 0-volt thresholds. This allows cell read with control-gate voltages less than one volt. With proper circuit design in non-array applications, cell over-erasure does not cause problems found with over-erasure of cells arranged in an array. Endurance of 1,000 cycles and data retention has been demonstrated. Using FN tunneling in place of band-to-band tunneling minimizes oxide damage during erase.

Although the present invention has been described in the context of low-density non-volatile memory, the flash memory cell structure of the present invention can also be implemented in other application such as control of redundancy in SRAM and DRAM memories, ID or security code registers, and other switch functions.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A single-poly memory cell, comprising:
   (a) a control device;
   (b) a switch device; and
   (c) an erase device comprising an erase gate, wherein:
      the control, switch, and erase devices share a common, polysilicon floating gate configured to retain charge as a result of programming the memory cell; and
      the memory cell is configured to be erased by causing tunneling between the erase gate and the floating gate without causing any junction breakdown within the memory cell.

2. The invention of claim 1, wherein:
   the control device is a first PMOS transistor;
   the switch device is an NMOS transistor; and
   the erase device is a second PMOS transistor.

3. The invention of claim 1, wherein the memory cell is of a 0.25-micron or smaller CMOS technology.

4. The invention of claim 1, wherein a gate capacitance of the erase device is less than about 0.25 times a total capacitance for the floating gate.

5. The invention of claim 1, wherein a portion of the floating gate corresponding to the control device has a non-rectangular pattern that adds capacitance between the floating gate and a control gate of the control device.

6. The invention of claim 1, wherein the control device has an additional polysilicon structure electrically connected to the floating gate to add capacitance between the floating gate and a control gate of the control device.

7. The invention of claim 1, wherein the control device has a metal structure electrically connected to add capacitance between the floating gate and a control gate of the control device.

8. The invention of claim 1, wherein the erase gate of the erase device is electrically connected to a tub of the erase device to apply the erase voltage between the erase gate and the floating gate, wherein a minimum tub-to-source/drain breakdown voltage of the erase device is greater than the erase voltage.

9. The invention of claim 1, wherein the tunneling is caused by applying an erase voltage to the erase gate of the erase device.

10. The invention of claim 9, wherein the erase voltage is applied without exceeding any junction breakdown voltage within the memory cell.

11. The invention of claim 1, wherein:
the control device is a first PMOS transistor;
the switch device is an NMOS transistor;
the erase device is a second PMOS transistor;
the memory cell is of a 0.25-micron or smaller CMOS technology;
a gate capacitance of the erase device is less than about 0.25 times a total capacitance for the floating gate;
a portion of the floating gate corresponding to the control device has a non-rectangular pattern that adds capacitance between the floating gate and a control gate of the control device;
the control device has an additional polysilicon structure electrically connected to the floating gate to add capacitance between the floating gate and a control gate of the control device;
the control device has a metal structure electrically connected to add capacitance between the floating gate and a control gate of the control device;
the erase gate of the erase device is electrically connected to a tub of the erase device to apply the erase voltage between the erase gate and the floating gate, wherein a minimum tub-to-source/drain breakdown voltage of the erase device is greater than the erase voltage;
the tunneling is caused by applying an erase voltage to the erase gate of the erase device; and
the erase voltage is applied without exceeding any junction breakdown voltage within the memory cell.

12. An integrated circuit having at least one single-poly memory cell comprising:
(a) a control device;
(b) a switch device; and
(c) an erase device comprising an erase gate, wherein:
the control, switch, and erase devices share a common, polysilicon floating gate configured to retain charge as a result of programming the memory cell; and
the memory cell is configured to be erased by causing tunneling between the erase gate and the floating gate without causing any junction breakdown within the memory cell.

13. The invention of claim 12, wherein:
the control device is a first PMOS transistor;
the switch device is an NMOS transistor; and
the erase device is a second PMOS transistor.

14. The invention of claim 12, wherein the memory cell is of a 0.25-micron or smaller CMOS technology.

15. The invention of claim 12, wherein a gate capacitance of the erase device is less than about 0.25 times a total capacitance for the floating gate.

16. The invention of claim 12, wherein a portion of the floating gate corresponding to the control device has a non-rectangular pattern that adds capacitance between the floating gate and a control gate of the control device.

17. The invention of claim 12, wherein the control device has an additional polysilicon structure electrically connected to the floating gate to add capacitance between the floating gate and a control gate of the control device.

18. The invention of claim 12, wherein the control device has a metal structure electrically connected to add capacitance between the floating gate and a control gate of the control device.

19. The invention of claim 12, wherein the erase gate of the erase device is electrically connected to a tub of the erase device to apply the erase voltage between the erase gate and the floating gate, wherein a minimum tub-to-source/drain breakdown voltage of the erase device is greater than the erase voltage.

20. The invention of claim 12, wherein the tunneling is caused by applying an erase voltage to the erase gate of the erase device.

21. The invention of claim 20, wherein the erase voltage is applied without exceeding any junction breakdown voltage within the memory cell.

22. The invention of claim 12, wherein:
the control device is a first PMOS transistor;
the switch device is an NMOS transistor;
the erase device is a second PMOS transistor;
the memory cell is of a 0.25-micron or smaller CMOS technology;
a gate capacitance of the erase device is less than about 0.25 times a total capacitance for the floating gate;
a portion of the floating gate corresponding to the control device has a non-rectangular pattern that adds capacitance between the floating gate and a control gate of the control device;
the control device has an additional polysilicon structure electrically connected to the floating gate to add capacitance between the floating gate and a control gate of the control device; the control device has a metal structure electrically connected to add capacitance between the floating gate and a control gate of the control device;
the erase gate of the erase device is electrically connected to a tub of the erase device to apply the erase voltage between the erase gate and the floating gate, wherein a minimum tub-to-source/drain breakdown voltage of the erase device is greater than the erase voltage;
the tunneling is caused by applying an erase voltage to the erase gate of the erase device; and
the erase voltage is applied without exceeding any junction breakdown voltage within the memory cell.

* * * * *